United States Patent
Wang et al.

(10) Patent No.: US 12,279,467 B2
(45) Date of Patent: Apr. 15, 2025

(54) SUBSTRATE, BACKLIGHT MODULE, AND DISPLAY APPARATUS

(71) Applicant: BOE Technology Group Co., Ltd., Beijing (CN)

(72) Inventors: Ke Wang, Beijing (CN); Zhanfeng Cao, Beijing (CN); Qi Qi, Beijing (CN); Yan Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 127 days.

(21) Appl. No.: 17/769,022

(22) PCT Filed: Jun. 11, 2021

(86) PCT No.: PCT/CN2021/099789
§ 371 (c)(1),
(2) Date: Apr. 14, 2022

(87) PCT Pub. No.: WO2021/259085
PCT Pub. Date: Dec. 30, 2021

(65) Prior Publication Data
US 2024/0105893 A1    Mar. 28, 2024

(30) Foreign Application Priority Data

Jun. 22, 2020    (CN) .......................... 202021171850.5

(51) Int. Cl.
*H10H 20/857*    (2025.01)
*H01L 25/16*    (2023.01)

(52) U.S. Cl.
CPC ........ *H10H 20/857* (2025.01); *H01L 25/167* (2013.01)

(58) Field of Classification Search
CPC ............................. H01L 33/62; H01L 25/167
See application file for complete search history.

(56) References Cited

U.S. PATENT DOCUMENTS

| | | | |
|---|---|---|---|
| 2012/0107979 A1* | 5/2012 | Moon | H01L 33/0093 257/E33.013 |
| 2015/0013882 A1* | 1/2015 | Ma | H01L 21/67115 156/379.7 |
| 2017/0256686 A1* | 9/2017 | Li | H01L 33/56 |

(Continued)

FOREIGN PATENT DOCUMENTS

| | | |
|---|---|---|
| CN | 107731702 A | 2/2018 |
| CN | 109494292 A | 3/2019 |

(Continued)

*Primary Examiner* — Andres Munoz
*Assistant Examiner* — Neil R Prasad
(74) *Attorney, Agent, or Firm* — WHDA, LLP

(57) ABSTRACT

A substrate, a backlight module, and a display apparatus, which relates to the technical field of display. The substrate is configured to display or provide a backlight, and the substrate includes: a bonding region (OB) and a plurality of light-emitting regions (OA); each of the plurality of light-emitting regions (OA) includes a first metal layer (1) and a first conductive adhesive (2) located on the first metal layer (1), the first conductive adhesive (2) is a photo-curing conductive adhesive; and the bonding region (OB) includes a second metal layer (3) and a second conductive adhesive (4) located on the second metal layer (3).

19 Claims, 2 Drawing Sheets

(56) References Cited

U.S. PATENT DOCUMENTS

| | | | |
|---|---|---|---|
| 2019/0392751 A1* | 12/2019 | Hsieh | ............... H01L 33/504 |
| 2020/0066954 A1* | 2/2020 | Kuo | ............... H01L 33/42 |
| 2020/0075816 A1 | 3/2020 | Cheng et al. | |
| 2020/0201392 A1 | 6/2020 | Yu et al. | |
| 2021/0091281 A1 | 3/2021 | Lv et al. | |

FOREIGN PATENT DOCUMENTS

| | | |
|---|---|---|
| CN | 109658831 A | 4/2019 |
| CN | 110634840 A | 12/2019 |
| CN | 212113055 U | 12/2020 |

* cited by examiner

SUBSTRATE, BACKLIGHT MODULE, AND DISPLAY APPARATUS

CROSS REFERENCE TO RELEVANT APPLICATIONS

The present disclosure claims the priority of the Chinese patent application filed on Jun. 22$^{nd}$, 2020 before the Chinese Patent Office with the application number of 202021171850.5 and the title of "SUBSTRATE, BACKLIGHT MODULE, AND DISPLAY APPARATUS", which is incorporated herein in its entirety by reference.

TECHNICAL FIELD

The present disclosure relates to the technical field of display, and more particularly, to a substrate, a backlight module, and a display apparatus.

BACKGROUND

A micro light-emitting diode (Mini/Micro LED) substrate requires a lower resistance of metal wiring, so copper metal is generally used as the wiring material. In a manufacturing process of the substrate, it is usually necessary to perform the LED bonding of the light-emitting region and the flexible printed circuit (FPC) bonding of the bonding region. The current mainstream LED bonding is to first apply a conductive adhesive on a LED window position of the substrate (that is, an exposed position of the LED PAD copper metal), then bond the LED chip to the substrate by mass transfer, and finally use a reflow soldering (230° C.-260° C. curing) method to cure the conductive adhesive. After the LED bonding, a conventional hot-pressing method is used for FPC bonding with the general temperature between 130° C. and 150° C.

SUMMARY

The present disclosure provides a substrate, a backlight module, and a display apparatus.

The embodiments of the present disclosure use the following technical solutions:

in one aspect, a substrate is provided, the substrate is configured to display or provide a backlight, and the substrate includes: a bonding region and a plurality of light-emitting regions;

each of the plurality of light-emitting regions includes a first metal layer and a first conductive adhesive located on the first metal layer, and the first conductive adhesive is a photo-curing conductive adhesive; and the bonding region includes a second metal layer and a second conductive adhesive located on the second metal layer.

Optionally, the photo-curing conductive adhesive is a UV-curing conductive adhesive or a laser-curing conductive adhesive.

Optionally, a material of the UV-curing conductive adhesive includes a UV light fixing-adhesive and a nano metal powder.

Optionally, a material of the laser-curing conductive adhesive includes a laser-curing adhesive and a nano metal powder.

Optionally, the first conductive adhesive is doped with a conductive metal ball.

Optionally, a particle size range of the conductive metal ball is 5 μm-30 μm.

Optionally, the conductive metal balls are tin metal balls or copper metal balls.

Optionally, wherein the tin metal balls or the copper metal balls are solid metal balls; or each of the tin metal balls is a metal ball with a core-shell structure and is formed by coating tin metal on a plastic sphere, or each of the copper metal balls is a metal ball with a core-shell structure and is formed by coating copper metal on a plastic sphere.

Optionally, the second conductive adhesive is a thermal-curing conductive adhesive.

Optionally, the first metal layer and the second metal layer are disposed in a same layer.

Optionally, each of the plurality of light-emitting regions further includes a light-emitting structure, a first insulation layer and a first connection hole, the first insulation layer is located between the light-emitting structure and the first metal layer, the first connection hole penetrates through the first insulation layer, the first conductive adhesive is located in the first connection hole, and the light-emitting structure is electrically connected to the first metal layer via the first conductive adhesive; and the bonding region further includes a circuit board, a second insulation layer and a second connection hole, the second insulation layer is located between the circuit board and the second metal layer, the second connection hole penetrates through the second insulation layer, the second conductive adhesive is located in the second connection hole, and the circuit board is electrically connected to the second metal layer via the second conductive adhesive.

Optionally, the first insulation layer includes a first insulation sublayer and a first planarization sublayer, and the second insulation layer includes a second insulation sublayer and a second planarization sublayer.

Optionally, the light-emitting structure is a micro light-emitting diode chip.

Optionally, each of the plurality of light-emitting regions further includes a third metal layer, a third insulation layer and a third connection hole, the third insulation layer is located between the third metal layer and the first metal layer, the third connection hole penetrates through the third insulation layer, and the third metal layer is electrically connected to the first metal layer via the third connection hole; and the bonding region further includes a fourth metal layer, a fourth insulation layer and a fourth connection hole, the fourth insulation layer is located between the fourth metal layer and the second metal layer, the fourth connection hole penetrates through the fourth insulation layer, and the fourth metal layer is electrically connected to the second metal layer via the fourth connection hole.

Optionally, the third insulation layer includes a third insulation sublayer and a third planarization sublayer, and the fourth insulation layer includes a fourth insulation sublayer and a fourth planarization sublayer.

Optionally, materials of the first metal layer and the second metal layer are copper, aluminum, molybdenum, or titanium.

In another aspect, a backlight module is provided, and the backlight module includes the above substrate.

In another aspect, a display apparatus is provided, and the display apparatus includes the above substrate.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art may obtain other figures according to these figures without paying creative work.

DETAILED DESCRIPTION OF THE EMBODIMENTS

Figure 1:
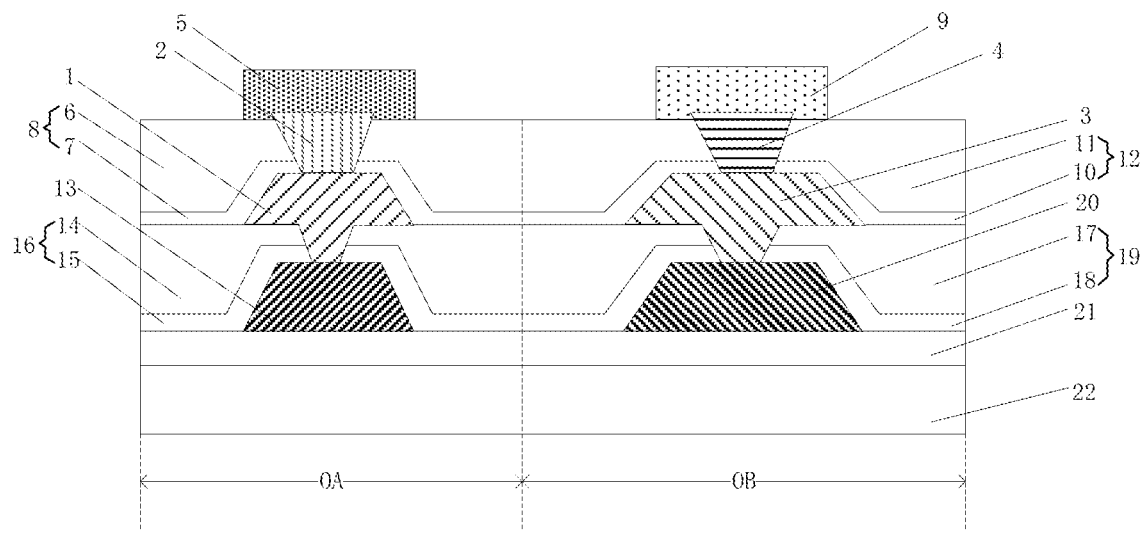
FIG. 1 is a structural schematic diagram of a substrate according to an embodiment of the present disclosure.

In order to make the technical solutions of the embodiments of the present disclosure clearer, the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, words such as "first", "second", "third", and "fourth", are used to distinguish the same items or similar items with basically the same functions and effects, which are only for the purpose of clearly describing the technical solutions of the embodiments of the present disclosure, and should not be understood to indicate or imply relative importance or to imply the quantity of technical features indicated.

In the embodiments of the present disclosure, unless otherwise indicated, "plurality" means two or more; the orientation or positional relationship indicated by the term "upper" and the like is based on the orientation or positional relationship shown in the drawings, and is only for the convenience of describing the present disclosure and simplifying the description, rather than indicating or implying that the referred device or element must have a specific orientation, are constructed and operated in a particular orientation and are therefore not to be construed as limitations of the present disclosure.

The embodiment of the present disclosure provides a substrate, the substrate is configured to display or provide a backlight, referring to FIG. 1, the substrate includes: a bonding region OB and a plurality of light-emitting regions OA; the light-emitting region OA includes a first metal layer 1 and a first conductive adhesive 2 located on the first metal layer 1; the first conductive adhesive 2 is a photo-curing conductive adhesive; and the bonding region OB includes a second metal layer 3 and a second conductive adhesive 4 located on the second metal layer 3.

The above-mentioned substrate may be selected for displaying or providing a backlight according to the practical situation. When the substrate is used for displaying, the above-mentioned substrate may be used as a display substrate to form a display panel; at this time, a plurality of light-emitting regions constitute an active area (AA), and the active area refers to the area used for displaying. When it is used to provide a backlight, the above-mentioned substrate may be used as a back plane.

The light-emitting color of the plurality of light-emitting regions included in the substrate is not limited here; the above-mentioned light-emitting region may be any one of a red light-emitting region, a green light-emitting region, or a blue light-emitting region. Since the substrate includes the plurality of light-emitting regions at the same time, the substrate may also include light-emitting regions with three light-emitting colors: red, green, and blue; certainly, it may only include light-emitting regions with one light-emitting color, for example: the substrate only includes a plurality of red light-emitting regions, or only includes a plurality of green light-emitting regions, or only includes a plurality of blue light-emitting regions. Specifically, it may be determined according to practical requirements.

The materials of the first metal layer and the second metal layer are not limited here. For example, the materials of the first metal layer and the second metal layer may be copper, aluminum, molybdenum, titanium and so on. Considering that in practical applications, copper has a lower resistance, then the first metal layer and the second metal layer are both made of copper.

The materials of the first conductive adhesive and the second conductive adhesive are not limited. For example, the materials of the first conductive adhesive and the second conductive adhesive may be manufactured by using an adhesive doped with a conductive material; for example, the adhesive may be an epoxy resin, and the conductive material may be metal particles.

The meaning of the above photo-curing conductive adhesive is: a conductive adhesive that may be cured by light irradiation. The curing effect of the conductive adhesive is affected by factors such as the type of the light, the irradiation intensity of the light, and the irradiation time.

The control method of the plurality of light-emitting regions is not limited. For example, the partitioned display of the substrate (when the substrate is used to display) or the partitioned supply of light source (when the substrate is used to provide backlight) may be implemented through a partition control.

An embodiment of the present disclosure provides a substrate, a backlight module, and a display apparatus. The substrate is used for displaying or providing a backlight, and includes: a bonding region and a plurality of light-emitting regions; the light-emitting region includes a first metal layer and a first conductive adhesive located on the first metal layer; the first conductive adhesive is a photo-curing conductive adhesive; the bonding region includes a second metal layer and a second conductive adhesive located on the second metal layer. The first conductive adhesive in the above-mentioned light-emitting region of the substrate is a photo-curing conductive adhesive; in this way, in the production process of the substrate, a light may be used to only illuminate the area where the first conductive adhesive is located, so as to cure the first conductive adhesive, and at the same time a mask is used to block the bonding region, so as to avoid an oxidation of the second metal layer of the bonding region under the influence of light illumination; the substrate may avoid the oxidation of the second metal layer of the bonding region due to cure the first conductive adhesive of the light-emitting region, thereby ensuring the normal operation of the subsequent process, and improving the production efficiency; at the same time, it may also improve the product yield.

Optionally, the photo-curing conductive adhesive is a UV-curing conductive adhesive or a laser-curing conductive adhesive.

The meaning of the above laser-curing conductive adhesive is: a conductive adhesive that is cured by the heat generated by the laser radiation.

The components of the above-mentioned UV-curing conductive adhesive and laser-curing conductive adhesive are not limited here. Illustratively, the components of the UV-curing conductive adhesive include a UV light fixing-adhesive and a nano metal powder; the components of the laser-curing conductive adhesive include a laser-curing adhesive and a nano metal powder.

Optionally, in order to improve the conductive function, the first conductive adhesive is doped with conductive metal balls.

The meaning of the above-mentioned doping is: adding a small amount of other elements or compounds to make the material have better properties. The above-mentioned first conductive adhesive is doped with conductive metal balls, that is, a small amount of conductive metal balls are doped into the first conductive adhesive, so that the first conductive adhesive has a better conductivity.

The structure of the above-mentioned conductive metal ball is not limited here. For example, the conductive metal ball may be a metal ball with a hollow structure or a metal ball with a solid structure. The material of the above-mentioned conductive metal ball is not limited here.

Optionally, a particle size range of the conductive metal ball is 5 μm-30 μm.

The specific particle size of the conductive metal ball in the above particle size range is not limited here. For example, the particle size of the conductive metal ball may be 5 μm, 15 μm or 30 μm.

Optionally, the conductive metal ball is a tin metal ball or a copper metal ball.

The above-mentioned tin metal ball may be a solid Sn metal ball, or may be a tin metal ball with a core-shell structure formed by coating tin metal on a plastic sphere.

The above-mentioned copper metal ball may be a solid Cu metal ball, or may be a copper metal ball with a core-shell structure formed by coating copper metal on a plastic sphere.

Optionally, in order to facilitate the curing of the second conductive adhesive in the subsequent hot-pressing process, the second conductive adhesive is a thermal-curing conductive adhesive.

Optionally, the first metal layer and the second metal layer are disposed in a same layer.

Disposing the first metal layer and the second metal layer in a same layer here refers to the production by using the one-time patterning process. The one-time patterning process refers to the process of forming the required layer structure through one exposure. The one-time patterning process includes masking, exposure, development, etching, stripping, and so on.

Optionally, referring to FIG. 1, the light-emitting region OA further includes a light-emitting structure 5, a first insulation layer 8 and a first connection hole (not marked in FIG. 1), the first insulation layer 8 is located between the light-emitting structure 5 and the first metal layer 1, the first connection hole penetrates through the first insulation layer 8, the first conductive adhesive 2 is located in the first connection hole, and the light-emitting structure 5 is electrically connected to the first metal layer 1 via the first conductive adhesive 2.

Referring to FIG. 1, the bonding region OB further includes a circuit board 9, a second insulation layer 12 and a second connection hole (not marked in FIG. 1), the second insulation layer 12 is located between the circuit board 9 and the second metal layer 3, the second connection hole penetrates through the second insulation layer 12, the second conductive adhesive 4 is located in the second connection hole, and the circuit board 9 is electrically connected to the second metal layer 3 via the second conductive adhesive 4.

The meanings of the first connection hole penetrates through the first insulation layer and the second connection hole penetrates through the second insulation layer are as follows: the first insulation layer where the first connection hole is located is removed, or the second insulation layer where the second connection hole is located is removed.

The above-mentioned first insulation layer may include a first insulation sublayer 7 and a first planarization sublayer 6 as shown in FIG. 1, wherein the first insulation sublayer 7 plays a role of insulation, and the first planarization sublayer 6 may play roles of both insulation and planarization.

The second insulation layer may include a second insulation sublayer 10 and a second planarization sublayer 11 as shown in FIG. 1, wherein the second insulation sublayer 10 plays a role of insulation, and the second planarization sublayer 11 may play roles of both insulation and planarization.

Optionally, the light-emitting structure is a micro light-emitting diode chip.

The types of the above-mentioned micro light-emitting diode chip are not limited here. For example, the micro light-emitting diode chip may be a Mini LED chip or a Micro LED chip.

The shape and light-emitting color of the above-mentioned micro light-emitting diode chip are not limited here. For example, the shape of the above-mentioned micro light-emitting diode chip may be a rectangle, and the light-emitting color of the above-mentioned micro light-emitting diode chip may be white.

Optionally, referring to FIG. 1, the light-emitting region OA further includes a third metal layer 13, a third insulation layer 16 and a third connection hole (not marked in FIG. 1), the third insulation layer 16 is located between the third metal layer 13 and the first metal layer 1, the third connection hole penetrates through the third insulation layer 16, and the third metal layer 13 is electrically connected to the first metal layer 1 via the third connection hole.

Referring to FIG. 1, the bonding region OB further includes a fourth metal layer 20, a fourth insulation layer 19 and a fourth connection hole (not marked in FIG. 1), the fourth insulation layer 19 is located between the fourth metal layer 20 and the second metal layer 3, the fourth connection hole penetrates through the fourth insulation layer 19, and the fourth metal layer 20 is electrically connected to the second metal layer 3 via the fourth connection hole.

The meanings of the third connection hole penetrates through the third insulation layer and the fourth connection hole penetrates through the fourth insulation layer are as follows: the third insulation layer where the third connection hole is located is removed, or the fourth insulation layer where the fourth connection hole is located is removed.

The above-mentioned third insulation layer may include a third insulation sublayer 15 and a third planarization sublayer 14 as shown in FIG. 1, wherein the third insulation sublayer 15 plays a role of insulation, and the third planarization sublayer 14 may play roles of both insulation and planarization.

The fourth insulation layer 19 may include a fourth insulation sublayer 18 and a fourth planarization sublayer 17 as shown in FIG. 1, wherein the fourth insulation sublayer 18 plays a role of insulation, and the fourth planarization sublayer 17 may play roles of both insulation and planarization.

It should be noted that the above-mentioned light-emitting regions and bonding region are all located on the organic layer 21 as shown in FIG. 1, and the organic layer 21 is located on a base plate 22. When the above-mentioned substrate is a flexible substrate, the organic layer is a flexible base plate, such as polyimide (PI); the base plate is a rigid base plate, and the base plate is finally peeled off. When the above-mentioned substrate is a rigid substrate, the organic layer is an organic buffer layer, the base plate is a rigid base plate, and the base plate is remained.

An embodiment of the present disclosure provides a backlight module, including the substrate as in the above embodiments. The backlight module has the characteristics of low power consumption, long service life, and the light source capable to be controlled by regions. According to the prior art, the backlight module may further include structures such as a diffusion sheet, a driving circuit, and so on, which may be determined according to practical needs, and will not be repeated here.

The backlight module may be used in any display apparatus or component that needs to provide backlight. The backlight module may be a rigid backlight module or a flexible backlight module (i.e., bendable or foldable); or any sort of other backlight modules.

For the structure of the substrate involved in the embodiment, reference may be made to the above embodiment, which will not be repeated here.

An Embodiment of the present disclosure provides a display apparatus including the substrate as in the above embodiments.

The display apparatus may be a rigid display apparatus or a flexible display apparatus (i.e., bendable or foldable). The display apparatus may be any one of a Micro OLED micro display apparatus, a Mini LED micro display apparatus or other micro display apparatuses, as well as any product or component with a display function, such as a TV, a digital camera, a mobile phone, a tablet computer, etc. including these micro display apparatuses.

For the structure of the substrate involved in the embodiment, reference may be made to the above embodiment, which will not be repeated here.

An embodiment of the present disclosure provides a manufacturing method of the substrate as in the above embodiments. The manufacturing method of the substrate includes:

S10, forming an organic layer over a base plate.

Figure 2:
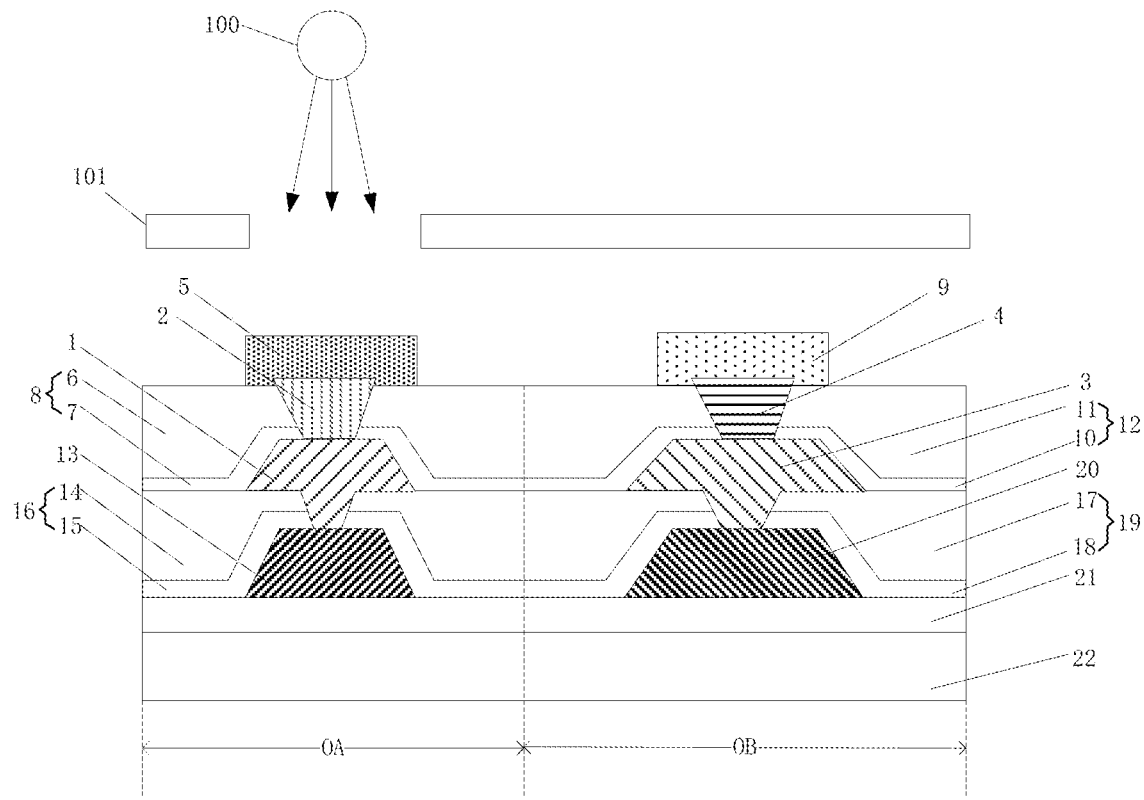
FIG. 2 is a structural schematic diagram of another substrate according to an embodiment of the present disclosure.

S11, forming a third metal layer 13 and a fourth metal layer 20 as shown in FIG. 2 on the organic layer, wherein materials of the third metal layer and the fourth metal layer may be copper; the third metal layer and the fourth metal layer may be collectively referred as a first copper layer (Cu1).

Figure 3:
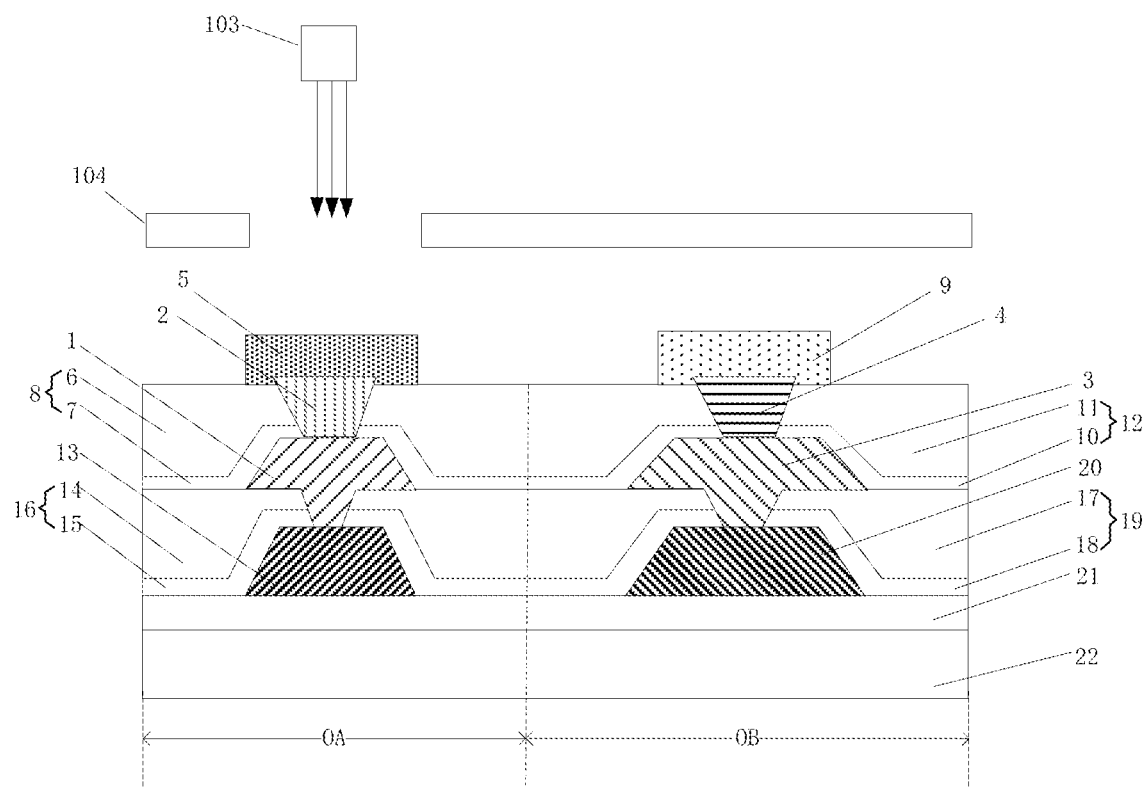
FIG. 3 is a structural schematic diagram of another substrate according to an embodiment of the present disclosure.

S12, referring to FIG. 2 and FIG. 3, forming a third insulation layer 16 on the third metal layer 13, and forming a fourth insulation layer 19 on the fourth metal layer 20. The third insulation layer 16 may include a third insulation sublayer 15 and a third planarization sublayer 14. The fourth insulation layer 19 may include a fourth insulation sublayer 18 and a fourth planarization sublayer 17.

Wherein, the third insulation sublayer and the fourth insulation sublayer may be collectively referred as a first protective layer (PVX1), the third planarization sublayer and the fourth planarization sublayer may be collectively referred as a first planarization layer (OC1).

S13, referring to FIG. 2 and FIG. 3, forming a first metal layer 1 on the third insulation layer 16, and forming a second metal layer 3 on the fourth insulation layer 19; wherein, the first metal layer and the second metal layer may be collectively referred as a second copper layer (Cu2).

S14, referring to FIG. 2 and FIG. 3, forming a first insulation layer 8 on the first metal layer 1, and forming a second insulation layer 12 on the second metal layer 3. Wherein, the first insulation layer 8 may include a first insulation sublayer 7 and a first planarization sublayer 6. The second insulation layer 12 may include a second insulation sublayer 10 and a second planarization sublayer 11.

Wherein, the first insulation sublayer and the second insulation sublayer may be collectively referred as a second protective layer (PVX2), the first planarization sublayer and the second planarization sublayer may be collectively referred as a second planarization layer (OC2).

The manufacturing methods of the first copper layer (Cu1), the first protective layer (PVX1), the first planarization layer (OC1), the second copper layer (Cu2), the second protective layer (PVX2), the second planarization layer (OC2) are not limited here. For example, the above-mentioned layer structure may be formed by a patterning process. The patterning process is a process of forming a thin film and including at least one pattern layer. The patterning process usually includes: coating photoresist (PR glue) on the film, exposing the photoresist with a mask, then using a developer to wash away the photoresist to be removed, and then etching the part of the film that does not cover the photoresist, and finally peeling off the remaining photoresist to form the desired layer.

It should be noted that four masks (i.e. four Mask process) are used in the above manufacturing method. Specifically, one mask is used to pattern the first copper layer (Cu1), pattern the first protective layer (PVX1) and the first flat layer (OC1), pattern the second copper layer (Cu2), and pattern the second protective layer (PVX2) and the second flat layer (OC2), respectively, a total of four masks.

The method of coating the photo-curing conductive adhesive and the subsequent manufacturing method are specifically described as below, by taking the photo-curing conductive adhesive to be the UV-curing conductive adhesive and the photo-curing conductive adhesive to be the laser-curing conductive adhesive as examples.

The first, the photo-curing conductive adhesive is the UV-curing conductive adhesive, and the manufacturing method of the substrate also includes:

S170, coating the UV-curing conductive adhesive in the first connection hole of the first insulation layer as shown in FIG. 2.

S171, placing a micro light-emitting diode chip (Mini/Micro LED chip) on the UV-curing conductive adhesive by mass transfer.

S172, placing a UV mask 101 as shown in FIG. 2 on the substrate, aligning the opening of the UV mask 101 with the position of the UV-curing conductive adhesive, and irradiating the position of the UV-curing conductive adhesive by the UV light source 100, to cure the LTV-curing conductive adhesive.

The time for the above-mentioned light source to irradiate the UV-curing conductive adhesive is not limited here, and it is determined according to the practical situation.

S173, removing the UV mask 101.

The second, the photo-curing conductive adhesive is the laser-curing conductive adhesive, and the manufacturing method of the substrate also includes:

S1700, coating the laser-curing conductive adhesive Sn paste or Cu paste in the first connection hole of the first insulation layer 8 as shown in FIG. 2 by a screen-printing process.

S1701, placing the micro light-emitting diode chip (Mini/Micro LED chip) on the laser-curing conductive adhesive by mass transfer.

S1702, placing the laser mask 104 as shown in FIG. 3 on the substrate, aligning the opening position of the laser mask 104 with the position of the laser-curing conductive adhesive, and irradiating the position of the laser-curing conductive adhesive by the laser light source 103, to cure the laser-curing conductive adhesive.

S1073, removing the laser mask 104.

In the above two manufacturing methods, first conductive adhesives with different materials are selected, and UV light/laser is used to irradiate only the area where the first conductive adhesive is located, to cure the first conductive adhesive; at the same time, an UV mask/laser mask is used to block the bonding region, to avoid the oxidation phenomenon of the second metal layer in the bonding region under the influence of light illumination.

After the curing of the above-mentioned photo-curing conductive adhesive is completed, the bonding region needs to be manufactured, and the manufacturing method further includes:

S18, coating a second conductive adhesive 4 in the second connection hole of the second insulation layer 12 as shown in FIG. 2.

S19, placing a circuit board 9 as shown in FIG. 2 on the second conductive adhesive 4.

The second conductive adhesive here is a thermal-curing conductive adhesive, in order to facilitate the subsequent hot-pressing process to cure the second conductive adhesive.

S20, curing the second conductive adhesive through a hot-pressing process, and pressing the circuit board to the bonding region of the substrate at the same time.

The above embodiments are only specific embodiments of the present disclosure, but the protection scope of the present disclosure is not limited to this. The changes or substitutions may be easily thought by any person skilled in the art within the technical scope disclosed by the present disclosure should be covered within the protection scope of the present disclosure. Therefore, the protection scope of the present disclosure should be subject to the protection scope of the claims.

The invention claimed is:

1. A substrate, wherein the substrate is configured to display or provide a backlight, and the substrate comprises:
a bonding region and a plurality of light-emitting regions;
   each of the plurality of light-emitting regions comprises a first metal layer and a first conductive adhesive located on the first metal layer, and the first conductive adhesive is a photo-curing conductive adhesive; and
   the bonding region comprises a second metal layer and a second conductive adhesive located on the second metal layer;
   each of the plurality of light-emitting regions further comprises a light-emitting structure, a first insulation layer and a first connection hole, the first insulation layer is located between the light-emitting structure and the first metal layer, the first connection hole penetrates through the first insulation layer, the first conductive adhesive is located in the first connection hole, and the light-emitting structure is electrically connected to the first metal layer via the first conductive adhesive; and
   the bonding region further comprises a circuit board, a second insulation layer and a second connection hole, the second insulation layer is located between the circuit board and the second metal layer, the second connection hole penetrates through the second insulation layer, the second conductive adhesive is located in the second connection hole, and the circuit board is electrically connected to the second metal layer via the second conductive adhesive.

2. The substrate according to claim 1, wherein the photo-curing conductive adhesive is a UV-curing conductive adhesive or a laser-curing conductive adhesive.

3. The substrate according to claim 2, wherein a material of the UV-curing conductive adhesive comprises a UV light fixing-adhesive and a nano metal powder.

4. The substrate according to claim 2, wherein a material of the laser-curing conductive adhesive comprises a laser-curing adhesive and a nano metal powder.

5. The substrate according to claim 1, wherein the first conductive adhesive is doped with conductive metal balls.

6. The substrate according to claim 5, wherein a particle size range of the conductive metal ball is 5 μm-30 μm.

7. The substrate according to claim 5, wherein the conductive metal balls are tin metal balls or copper metal balls.

8. The substrate according to claim 7, wherein the tin metal balls or the copper metal balls are solid metal balls; or
   each of the tin metal balls is a metal ball with a core-shell structure and is formed by coating tin metal on a plastic sphere, or
   each of the copper metal balls is a metal ball with a core-shell structure and is formed by coating copper metal on a plastic sphere.

9. The substrate according to claim 1, wherein the second conductive adhesive is a thermal-curing conductive adhesive.

10. The substrate according to claim 1, wherein the first metal layer and the second metal layer are disposed in a same layer.

11. The substrate according to claim 1, wherein the first insulation layer comprises a first insulation sublayer and a first planarization sublayer, and the second insulation layer comprises a second insulation sublayer and a second planarization sublayer.

12. The substrate according to claim 1, wherein the light-emitting structure is a micro light-emitting diode chip.

13. The substrate according to claim 12, wherein,
   each of the plurality of light-emitting regions further comprises a third metal layer, a third insulation layer and a third connection hole, the third insulation layer is located between the third metal layer and the first metal layer, the third connection hole penetrates through the third insulation layer, and the third metal layer is electrically connected to the first metal layer via the third connection hole; and
   the bonding region further comprises a fourth metal layer, a fourth insulation layer and a fourth connection hole, the fourth insulation layer is located between the fourth metal layer and the second metal layer, the fourth connection hole penetrates through the fourth insulation layer, and the fourth metal layer is electrically connected to the second metal layer via the fourth connection hole.

14. The substrate according to claim 13, wherein the third insulation layer comprises a third insulation sublayer and a third planarization sublayer, and the fourth insulation layer comprises a fourth insulation sublayer and a fourth planarization sublayer.

15. The substrate according to claim 1, wherein materials of the first metal layer and the second metal layer are copper, aluminum, molybdenum, or titanium.

16. A display apparatus, wherein the display apparatus comprises the substrate according to claim 1.

17. A backlight module, wherein the backlight module comprises a substrate, wherein, the substrate is configured to display or provide a backlight, and the substrate comprises:
a bonding region and a plurality of light-emitting regions;
each of the plurality of light-emitting regions comprises a first metal layer and a first conductive adhesive located on the first metal layer, and the first conductive adhesive is a photo-curing conductive adhesive; and
the bonding region comprises a second metal layer and a second conductive adhesive located on the second metal layer;
each of the plurality of light-emitting regions further comprises a light-emitting structure, a first insulation layer and a first connection hole, the first insulation layer is located between the light-emitting structure and the first metal layer, the first connection hole penetrates through the first insulation layer, the first conductive adhesive is located in the first connection hole, and the light-emitting structure is electrically connected to the first metal layer via the first conductive adhesive; and
the bonding region further comprises a circuit board, a second insulation layer and a second connection hole, the second insulation layer is located between the circuit board and the second metal layer, the second connection hole penetrates through the second insulation layer, the second conductive adhesive is located in the second connection hole, and the circuit board is electrically connected to the second metal layer via the second conductive adhesive.

18. The backlight module according to claim 17, wherein the photo-curing conductive adhesive is a UV-curing conductive adhesive or a laser-curing conductive adhesive.

19. The backlight module according to claim 17, wherein the first conductive adhesive is doped with conductive metal balls.

* * * * *